CIRCUIT SUPPORTING APPARATUS

Filed Oct. 20, 1960

INVENTORS
EDUARD LUEDICKE
& ALBERT H. MEDWIN
BY Morris Rabkin
ATTORNEY

United States Patent Office 3,076,862
Patented Feb. 5, 1963

3,076,862

CIRCUIT SUPPORTING APPARATUS

Eduard Luedicke, Somerville, and Albert H. Medwin, Whippany, N.J., assignors to Radio Corporation of America, a corporation of Delaware Filed Oct. 20, 1960, Ser. No. 63,912
7 Claims. (Cl. 174—68.5)

This invention relates generally to apparatus for supporting printed circuit boards and interconnecting conductors. More particularly, the invention relates to high-frequency circuit supporting apparatus adapted to cooperate with insulated conductors to form shielded transmission lines therewith of a predetermined, desired characteristic impedance. The circuit supporting apparatus of the present invention is particularly useful for supporting very high-frequency circuits in a manner to prevent interferential stray inductances and capacitances.

Circuits designed to operate at very high frequencies, in the order of hundreds of megacycles, for example, require the use of interconnecting conductors that prevent cross-talk and undesired stray inductances and capacitances. In other words, these high-frequency circuits require interconnecting conductors that are shielded transmission lines of a predetermined, desired characteristic impedance. At these very high frequencies, the dimensions of a conductor, its shielding, and its position in a circuit are critical if unwanted phase shifts and cross-talk are to be prevented. It has been proposed to interconnect high-frequency printed circuits with shielded cables of the coaxial type, that is, with transmission lines having inner and outer concentric conductors separated by an insulating material. However, the use of these relatively bulky transmission lines for interconnecting small, high-frequency, circuit components is somewhat unwieldy.

Accordingly, it is an object of the present invention to provide novel apparatus for supporting high-frequency circuits and for permitting the use of relatively thin, interconnecting conductors in a manner that will prevent cross-talk and undesired stray inductances and capacitances.

Another object of the present invention is to provide novel circuit supporting apparatus that will obviate the need for coaxial, interconnecting transmission lines by cooperating with insulated wire to form a transmission line therewith of a predetermined, desired characteristic impedance, as required by the supported circuit.

Still another object of the present invention is to provide novel supporting apparatus for removably supporting printed circuit boards and interconnecting, insulated wires in a manner whereby conductors on the printed circuit boards and the insulated wires become transmission lines having both a desired characteristic impedance and a common connection.

A further object of the present invention is to provide novel circuit supporting apparatus that is relatively simple in structure, easy to manufacture, and highly efficient in use.

In accordance with the present invention, the novel circuit supporting apparatus comprises, in its simplest form, a block member formed with at least one uniform channel therein. The channel is dimensioned so as to receive an insulated conductor snugly therein. The portions of the block member that define the channel comprise electrically conductive material for shielding the insulated conductor and for forming with the insulated conductor a transmission line having a predetermined, desired characteristic impedance. In another embodiment, the block member is formed with two sets of regularly spaced, parallel channels, one set of channels being relatively deep and disposed transversely to the other set of relatively shallow channels. Two or more block members may be fixed to each other to form a floor and one or more walls, for example, so that the shallow channels in one block member communicate with the shallow channels in an adjacent block member. Portions of each block member defining the channels comprise electrically conductive material. The shallower channels are adapted to receive printed circuit boards therein, and the deep channels, as well as the shallow channels, are adapted to receive snugly therein insulated conductors.

An important feature of the present invention is the combination of the circuit supporting apparatus with one or more printed circuit boards in a manner such that the electrically conductive material of the circuit supporting apparatus makes contact with a conductive backing on the printed circuit board to form a transmission line of a predetermined characteristic impedance with portions of the printed circuit.

The novel features of the present invention, both as to its organization and methods of fabrication, as well as additional objects and advantages thereof, will be more readily understood from the following description, when read in connection with the accompanying drawing, in which the same reference character represents similar parts, and in which.

Figures 1, 2, 3:
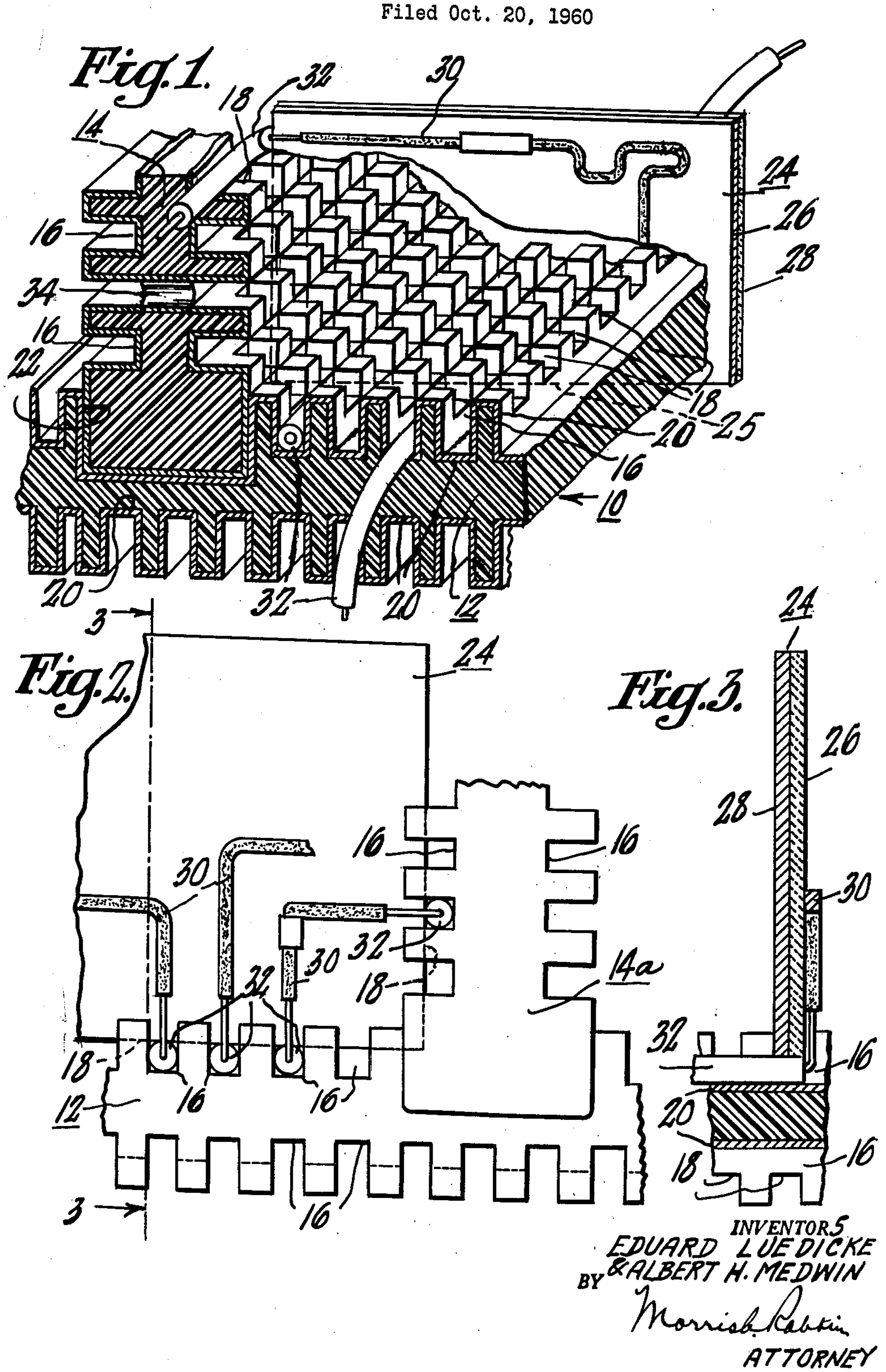
FIG. 1 is a perspective view of circuit supporting apparatus (with portions broken away and portions in cross-section) and a printed circuit board (with a portion broken away and a portion shown in phantom) positioned on the circuit supporting apparatus and connected to a conductor therein, all in accordance with the present invention.
FIG. 2 is a fragmentary, front, elevational view of circuit supporting apparatus and a printed circuit board supported thereon, showing conductors connected to the printed circuit in accordance with the present invention.
FIG. 3 is a cross-sectional view taken along the line 3—3 of FIG. 2.

Referring, now, particularly to FIG. 1, there is shown circuit supporting apparatus 10 comprising two interconnected block members 12 and 14. The member 12 may be considered a floor member and comprises a block of material formed with a plurality of relatively deep, regularly spaced, parallel channels 16 in the upper and lower surfaces thereof. These surfaces are also formed with a set of relatively shallow, regularly spaced, parallel channels 18 that are substantially perpendicular to the channels 16. The member 14 may be considered a wall member and is also formed with deep channels 16 and relatively shallow channels 18 similar to the channels in the member 12. The channelled members 12 and 14 may be cast from epoxy resin by means of suitable dies. This resin may or may not be electrically conductive. If the material of the members 12 and 14 is not a good electrical conductor, it is coated with a coating 20 of electrically conductive material by any suitable means.

The member 14 is attached to the member 12 by any suitable means so as to form wall and floor members, respectively. Thus, one end of the member 14 is inserted in a relatively wide, complementary channel 22 in the member 12 and held therein by friction, as shown in FIG. 1, or by any other siutable means, such as an electrically conductive cement. All of the deep channels 16 in the members 12 and 14 should be parallel to each other, and the respective, horizontal, shallow channels 18 in the floor member 12 should communicate with the respective, vertical, shallow channels 18 in the wall member 14 which are aligned therewith. When the block members 12 and 14 are so positioned, a printed circuit board 24 may be coupled thereto in a vertical plane by inserting it in communicating horizontal and vertical shallow channels 18, as indicated by the phantom lines 25 of the printed circuit board 24. Thus, the board 24 is supported along its bottom edge and along one side edge. The members 12 and 14 are in electrical contact with each other through their conductive coatings 20.

The printed circuit board 24 is rectangular in shape and may also be supported along its opposite vertical edge in the communicating shallow channels 18 of the floor members 12 and another wall member 14a, as shown in FIG. 2. The wall member 14a being also attached to the floor member 12 in spaced relation to the wall member 14. The board 24 comprises a sheet 26 of dielectric material, such as alumina, having an electrically conductive coating, or backing 28 on one side thereof. A printed circuit 30, including components thereof, are applied to the surface of the dielectric material 26 that is opposite to the backing 28. Portions of the printed circuit 30 are of uniform dimensions and cooperate with the dielectric material 26 and the conductive backing 28 to form transmission lines therewith. The transmission lines so formed have a predetermined characteristic impedance that is a function of the dimensions and electrical properties of the printed circuit 30, the dielectric constant of the material 26, and the conductive backing 28. These dimensions and electrical properties may be chosen to meet the circuit characteristics desired.

One or more printed circuit boards 24 may be positioned in the communicating shallow channels 18 of joined block members. The printed circuits 30 may be interconnected by insulated conductors or wires 32 that are adapted to fit snugly within the deep channels 16 of the block members. The insulated portion of each wire 32 lies within a deep channel 16, and the conductor of the wire 32 is soldered to the printed circuit 30 as near to the latter as possible, as shown in FIG. 3.

An important feature of the present invention is the combination of one or more block members with an insulated wire 32 to form a shielded transmission line therewith. The characteristic impedance of the transmission line thus formed is a function of the dimensions and electrical properties of the inner conductor of the wire 32, the dielectric insulating material of the wire 32, and the dimensions of the channel wherein the wire 32 lies. The width of the shallow channels 18 is substantially equal to the width of the deeper channels 16 so that an insulated wire 32 may be inserted in shallow channels 18 as well as in the deeper channels 16. Since the channels 16 are deeper than the channels 18, the circuit board 24 can be positioned in the shallow channels 18 without pinching any wires 32 in the deep channels.

Another important feature of the present invention is the combination of a block member and one or more circuit boards 24 supported thereon in a manner whereby the board's conductive backing 28 contacts the conductive material 20 on the block members. Thus, the conductive material 20 not only shields the insulated wire 32 and forms a transmission line therewith, but also acts as a common connection with the conductive backing 28, the backing 28 acting as a shield in the transmission line formed by portions of the printed circuit 30 and the dielectric material 26. When several circuit boards 24 are supported on the apparatus 10, one board behind the other, the backing 28 of one board functions as an electrical shield between the printed circuit on its board 24 and the printed circuit on an adjacent board 24.

In order to prevent wires 32 from crossing each other on one side of a block member (for example, the block member 14), an insulated wire may extend through a hole, such as the hole or passage 34 in that block member and continue in a deep channel 16 on the other side of the block member. Since the length of a wire is critical from the standpoint of producing unwanted phase shifts in high-frequency circuits, the desired length of wire 32 may be disposed in certain ones of both sets of channels 16 and 18, if necessary, in the manner explained above to cooperate with the conductive coating 20 and to form transmission lines therewith. An electrically conductive epoxy resin (not shown) may be placed over the wires 32 to complete the shielding of these wires when they are disposed in channels 16 and/or 18. However, conductive epoxy is not necessary in most cases because adequate shielding for the wires 32 is provided by the conductive coating 20.

From the foregoing description, it will be apparent that there has been provided novel circuit supporting apparatus for supporting high-frequency circuits and insulated conductors. Because conductive material defines the channels in the supporting apparatus, insulated conductors in the channels coact with the conductive material to form transmission lines therewith. This electrically conductive material also forms a common connection for the conductive backing of a printed circuit board when the printed circuit board is inserted in the appropriate channels of the block members. Under the latter condition, the conductive backing also forms a transmission line with connective portions of the printed circuit.

While only two forms of this invention have been described, other variations of the circuit supporting apparatus and combinations therewith of conductors and printed circuit boards coming within the spirit of this invention will, no doubt, readily suggest themselves to those skilled in the art. Hence, it is desired that the foregoing description of the invention shall be considered as illustrative and not in a limiting sense.

What is claimed is:

1. Apparatus for supporting a board adapted to have a circuit thereon and at least one electrical conductor connected thereto, said apparatus comprising at least two block members transversely disposed with respect to each other and fixed to each other, each of said members being formed with at least two intersecting channels, one of said channels in one of said members being parallel to one of said channels in the other of said members, the other of said channels in each of said members communicating with each other, and the portions of said members defining said channels comprising electrically conductive material and forming with said conductor a transmission line having a predetermined characteristic impedance when said conductor is disposed in one of said channels and insulated from said portions defining it, said other channels being adapted to receive said board therein.

2. Apparatus for supporting a board adapted to have a circuit thereon and at least one electrical conductor connected thereto, said apparatus comprising at least two members each lying in a different plane, said members being attached to each other, each of said members having at least one side formed with at least two intersecting channels, one of said channels in one of said members being parallel to one of said channels in the other of said members, the other of said channels in each of said members communicating with each other, and the portions of said members defining said channels comprising electrically conductive material and forming with said conductor a transmission line having a predetermined characteristic impedance when said conductor is disposed in one of said channels and insulated from said portions defining it, said other channels being adapted to receive said board therein and being shallower in depth than said one of said channels in each of said members, whereby said board may be disposed over the conductor in said one of said channels without pinching said conductor.

3. In combination, a floor member, a wall member attached to said floor member, each of said floor and wall members being formed with a first set of regularly spaced, parallel channels therein and with a second set of regularly spaced, parallel channels transversely disposed with respect to said first set of parallel channels, portions of said members defining said channels comprising electrically conductive material, a panel having circuit means on one side thereof and an electrically conductive backing on the other side thereof, said panel being positioned within a channel of said second set of parallel channels in at least one of said members, and wire disposed within at least one channel of said first set of parallel channels, said wire being insulated from said portions and forming with said conductive material of said portions a shielded transmission line with a predetermined characteristic impedance.

4. In combination, a floor member, a wall member attached to said floor member and extending therefrom, each of said floor and wall members being formed with a first set of regularly spaced, relatively deep, parallel channels therein and with a second set of regularly spaced, relatively shallow, parallel channels transversely disposed with respect to said first set of parallel channels, portions of said members defining said channels comprising electrically conductive material, a printed circuit board having circuit means on one side thereof and a conductive backing on the other side thereof, said board being positioned within a channel of said second set of parallel channels in each of said members, and an insulated wire disposed snugly within at least one channel of said first set of parallel channels and forming with said conductive material a shielded transmission line having a predetermined characteristic impedance.

5. In combination, a floor member, a wall member attached to said floor member and extending therefrom, each of said floor and wall members being formed with a first set of regularly spaced, relatively deep, parallel channels therein and with a second set of regularly spaced, relatively shallow, parallel channels transversely disposed with respect to said first set of parallel channels, portions of said members defining said channels comprising electrically conductive material, a printed circuit board having circuit means on one side thereof and an conductive backing on the other side thereof, said board being positioned within a channel of said second set of parallel channels in each of said members with said conductive backing in contact with said conductive material, and an insulated wire disposed snugly within at least one channel of said first set of parallel channels and forming with said conductive material a shielded transmission line having a predetermined characteristic impedance, said circuit means comprising conductive portions forming with said backing transmission lines having substantially said predetermined characteristic impedance, said wire being connected to said circuit means.

6. Apparatus for supporting an insulated conductor and a panel, said apparatus comprising, in combination, a member having one side formed with at least two channels therein, one of said channels being disposed transversely to the other of said channels, said one channel receiving a portion of said panel supporting said panel transversely with respect to said member, and said other channel being deeper than said one channel and receiving said insulated conductor therein, the portions of said member defining said channels comprising electrically conductive material and forming a shielded transmission line with said insulated conductor.

7. Apparatus for supporting circuit elements comprising a block member formed with a first set of regularly spaced, relatively deep, parallel channels and with a second set of regularly spaced, relatively shallow, parallel channels, the surface of said block member, including portions thereof defining said first set and said second set of said channels, comprising electrically conductive material, said second set of channels being disposed transversely with respect to said first set of parallel channels and communicating therewith, said first set and second set of channels being on the same side of said block member.

References Cited in the file of this patent

UNITED STATES PATENTS

| | | |
|---|---|---|
| 686,052 | Golding | Nov. 5, 1901 |
| 2,019,625 | O'Brien | Nov. 5, 1935 |
| 2,587,676 | Akers | Mar. 4, 1952 |
| 2,760,169 | Engelmann | Aug. 21, 1956 |
| 2,891,229 | Flanagan | June 16, 1959 |
| 2,963,626 | Du Val et al. | Dec. 6, 1960 |